(12) United States Patent
Nakamura et al.

(10) Patent No.: US 7,965,092 B2
(45) Date of Patent: Jun. 21, 2011

(54) DIFFERENTIAL SIGNAL TRANSMITTING APPARATUS AND A TEST APPARATUS

(75) Inventors: Takayuki Nakamura, Tokyo (JP); Toshiaki Awaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 343 days.

(21) Appl. No.: 12/204,814

(22) Filed: Sep. 5, 2008

(65) Prior Publication Data
US 2010/0001776 A1      Jan. 7, 2010

(30) Foreign Application Priority Data

Sep. 12, 2007   (JP) .................................. 2007-237087

(51) Int. Cl.
*G01R 31/26* (2006.01)
*G01R 31/00* (2006.01)
(52) U.S. Cl. ................ 324/762.01; 324/750.3
(58) Field of Classification Search .............. 324/750.3, 324/762.01; 327/155–163, 524
See application file for complete search history.

(56) References Cited

U.S. PATENT DOCUMENTS

| | | | | |
|---|---|---|---|---|
| 4,346,315 A * | 8/1982 | Roberts | .......................... | 327/277 |
| 6,333,955 B1 * | 12/2001 | Kawashima et al. | ......... | 376/233 |
| 6,469,493 B1 * | 10/2002 | Muething et al. | ........ | 324/762.01 |
| 6,603,340 B2 * | 8/2003 | Tachimori | ..................... | 327/262 |
| 6,801,969 B2 * | 10/2004 | Crafts et al. | .................. | 710/100 |
| 6,831,473 B2 * | 12/2004 | Iorga | .......................... | 324/750.02 |
| 6,888,415 B2 * | 5/2005 | Abidin et al. | .................... | 331/57 |
| 6,956,442 B2 * | 10/2005 | Groen et al. | ..................... | 331/57 |
| 7,112,984 B2 * | 9/2006 | Ishihara | ..................... | 324/750.3 |
| 7,274,232 B2 * | 9/2007 | Lin et al. | ....................... | 327/158 |
| 7,906,997 B2 * | 3/2011 | Paull | ............................. | 327/156 |
| 2005/0162208 A1 * | 7/2005 | Zhang et al. | .................. | 327/276 |
| 2006/0049820 A1 * | 3/2006 | Miller | ........................ | 324/158.1 |

FOREIGN PATENT DOCUMENTS

| | | |
|---|---|---|
| JP | UH06-019324 | 3/1994 |
| JP | 2000009804 | 1/2000 |
| WO | 2004090561 | 10/2004 |

OTHER PUBLICATIONS

"Office Action of Korean Counterpart Application", issued on Nov. 29, 2010, p. 1-p. 7, in which the listed reference was cited.

* cited by examiner

*Primary Examiner* — Ha Tran T Nguyen
*Assistant Examiner* — Joshua Benitez
(74) *Attorney, Agent, or Firm* — Jianq Chyun IP Office

(57) ABSTRACT

Provided is a differential signal transmission apparatus that transmits a differential signal expressed by a potential difference between a positive signal and a negative signal, including a positive signal transmission line that transmits the positive signal; a negative signal transmission line that transmits the negative signal; and a delay compensating circuit that compensates for a time difference between the positive signal and the negative signal with a variable compensation time.

13 Claims, 13 Drawing Sheets

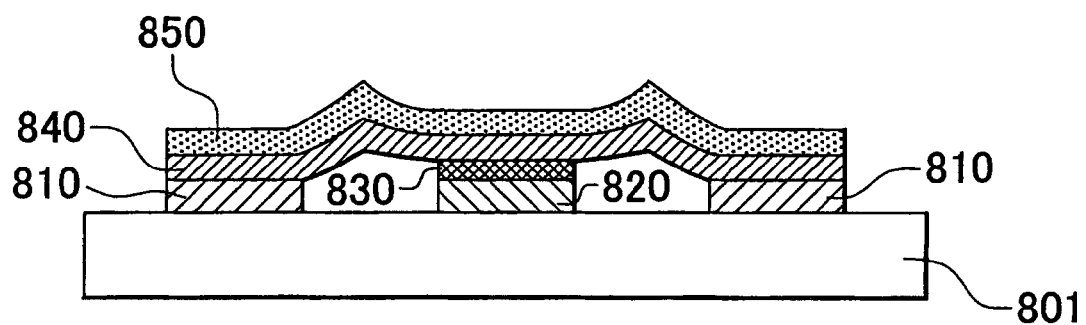
F I G . 5

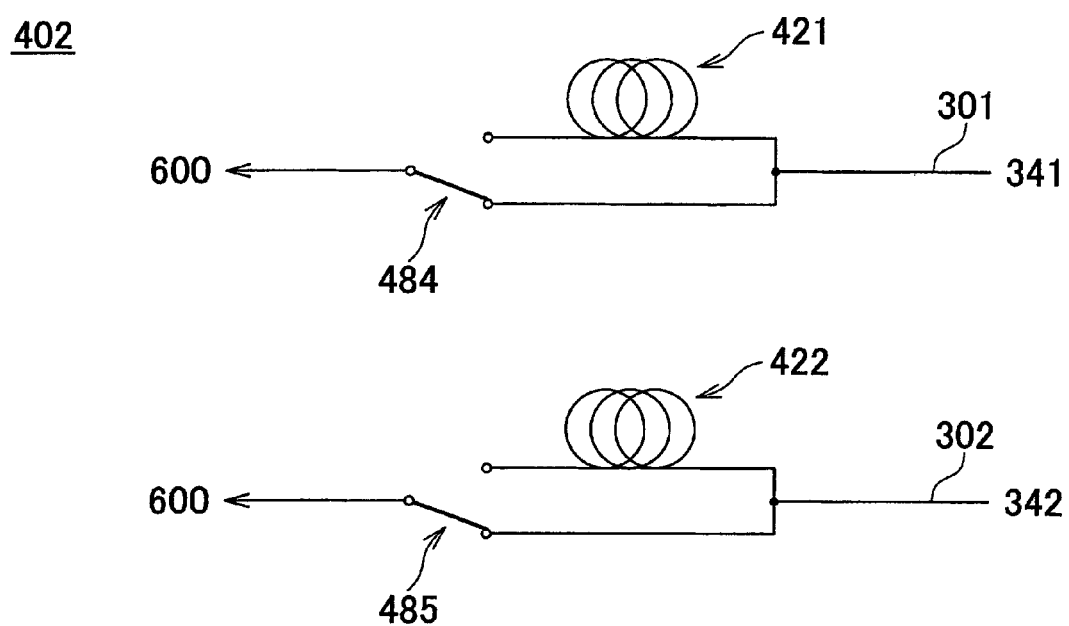
F I G. 11

DIFFERENTIAL SIGNAL TRANSMITTING APPARATUS AND A TEST APPARATUS

CROSS REFERENCE TO RELATED APPLICATION

The present application claims priority from a Japanese Patent Application No. 2007-237087 filed on Sep. 12, 2007, the contents of which are incorporated herein by reference.

BACKGROUND

1. Technical Field

The present invention relates to a differential signal transmission apparatus and a test apparatus using the differential signal transmission apparatus. In particular, the present invention relates to a differential signal transmission apparatus that transmits a differential signal and a test apparatus that uses the differential signal transmission apparatus.

2. Related Art

A test apparatus having a test head with multi-channel pin electronics circuit and a performance board that inputs a test signal generated by the pin electronics circuit into a device under test is known as in, for example, International Publication Pamphlet No. 2004/090561. A signal output apparatus that outputs a differential signal as the test signal to be input to the device under test is known to be used by the above test apparatus as in, for example, Japanese Patent Application Publication No. 2000-009804.

In the test apparatus described above, each multi-channel pin electronics circuit is connected to the performance board by a plurality of transmission lines. The plurality of transmission lines transmit test signals generated by the pin electronics circuit to the performance board. In order to decrease the noise in the transmission lines, the test apparatus includes positive signal transmission lines for transmitting positive signals and negative signal transmission lines for transmitting negative signals. In order to test a variety of semiconductor devices, the plurality of transmission lines are preferably able to send a single end signal in addition to the differential signal. In this case, the positive signal transmission line and the negative signal transmission line are both coaxial cables, and the positive signal and the negative signal are sent on the respective coaxial cables when transmitting the differential signal.

In the test apparatus described above, however, a difference in the length between the positive signal transmission line and the negative signal transmission line or a difference in characteristics of the electrical elements arranged on the positive signal transmission line and the negative signal transmission line causes a skew between the negative signal and the positive signal transmitted thereon. If the positive signal and the negative signal making up the differential signal are each transmitted on independent coaxial cables, the skew is very likely to occur between the signals because there is often a difference between the lengths of the transmission paths in the coaxial cable transmitting the positive signal and the coaxial cable transmitting the negative signal. This skew can cause an operational error in the semiconductor device being tested, which makes it difficult to accurately measure the signal output from the semiconductor device as a test result.

SUMMARY

Therefore, it is an object of an aspect of the innovations herein to provide a measurement apparatus, a test apparatus, an electronic device, a measurement method, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary differential signal transmission apparatus may include a differential signal transmission apparatus that transmits a differential signal expressed by a potential difference between a positive signal and a negative signal, including a positive signal transmission line that transmits the positive signal; a negative signal transmission line that transmits the negative signal; and a delay compensating circuit that compensates for a time difference between the positive signal and the negative signal with a variable compensation time.

According to a second aspect related to the innovations herein, one exemplary test apparatus may include a test signal generating section that generates a test signal input to a device under test; a pin electronics circuit that generates a differential test signal by converting the test signal into a differential signal expressed by a potential difference between a positive signal and a negative signal; and a performance board that receives the differential test signal and inputs the differential test signal to the device under test. The pin electronics circuit includes a positive signal transmission line that transmits the positive signal; a negative signal transmission line that transmits the negative signal; and a delay compensating circuit that compensates for a difference in transmission time between the positive signal and the negative signal, which is caused by a difference between a length of a transmission path including the positive signal transmission line and a length of a transmission path including the negative signal transmission line, the delay compensating circuit having a variable compensation time.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 5 is a cross-sectional view of the piezo element 850 in a stretched state taken along the line A-A of FIG. 3.

FIG. 11 shows a circuit configuration of a delay compensating circuit 402.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
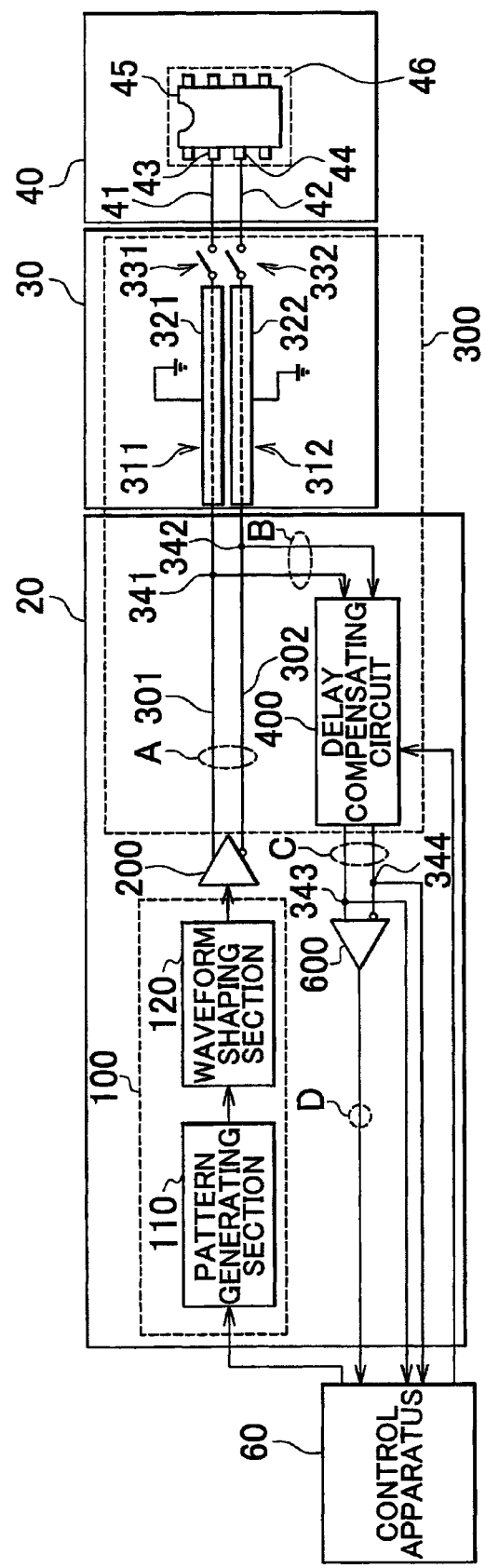
FIG. 1 shows a configuration of a test apparatus 10 according to an embodiment of the present invention.

FIG. 1 shows a configuration of a test apparatus 10 according to an embodiment of the present invention. As shown in FIG. 1, the test apparatus 10 is provided with a pin electronics circuit 20, a cable unit 30, a performance board 40, and a control apparatus 60.

The pin electronics circuit 20 includes a differential signal generating section 100, a driver 200, a delay compensating circuit 400, and a comparator 600. The differential signal generating section 100 includes a pattern generating section 110 and a waveform shaping section 120. In the differential signal generating section 100, the pattern generating section 110 is electrically connected to the waveform shaping section 120, and the waveform shaping section 120 is electrically connected to the input end of the driver 200.

The output end of the driver 200 is connected to one end of a positive signal transmission line 301 and one end of a negative signal transmission line 302. The other ends of the positive signal transmission line 301 and the negative signal transmission line 302 are connected to a section outside of the pin electronics circuit 20. The positive signal transmission line 301 and the negative signal transmission line 302 branch respectively at junctions 341 and 342 on the pin electronics circuit 20. The ends of both junctions 341 and 342 are electrically connected to the input end of the comparator 600 via the delay compensating circuit 400.

The cable unit 30 is provided between the pin electronics circuit 20 and the performance board 40, and includes a plurality of coaxial cables. The plurality of coaxial cables are connected to the positive signal transmission line 301 and the negative signal transmission line 302 on the pin electronics circuit 20, respectively. The coaxial cables respectively include a positive signal transmission line 311 and a negative signal transmission line 312, which are surrounded by respective shields 321 and 322 at a reference potential. The reference potential is a ground potential in the present embodiment, and is the same hereinafter. In the cable unit 30, the performance board 40 sides of the positive signal transmission line 311 and the negative signal transmission line 312 are respectively connected to switches 331 and 332.

The performance board 40 includes a socket 46, and the device under test 45 can be attached to and removed from this socket 46. The performance board 40 further includes a transmission path pattern having signal lines 41 and 42 electrically connected to terminals 43 and 44 of the device under test 45, respectively. The signal lines 41 and 42 are connected to the switches 331 and 332, respectively. When the switch 331 is closed, the terminal 43 of the device under test 45 is electrically connected to the positive signal transmission line 311 via the signal line 41 of the performance board 40. When the switch 332 is closed, the terminal 44 of the device under test 45 is electrically connected to the negative signal transmission line 312 via the signal line 42 of the performance board 40.

The control apparatus 60 is connected to the output end of the comparator 600. The control apparatus 60 is electrically connected to the transmission lines branching from the positive signal transmission line 301 and the negative signal transmission line 302 at the junctions 341 and 342 on the pin electronics circuit 20. The control apparatus 60 is electrically or mechanically connected to the pattern generating section 110 of the differential signal generating section 100 and a switch group, described hereinafter, arranged in the delay compensating circuit 400. The control apparatus 60 electrically or mechanically controls the pattern generating section 110 and the switch group.

Figure 2:
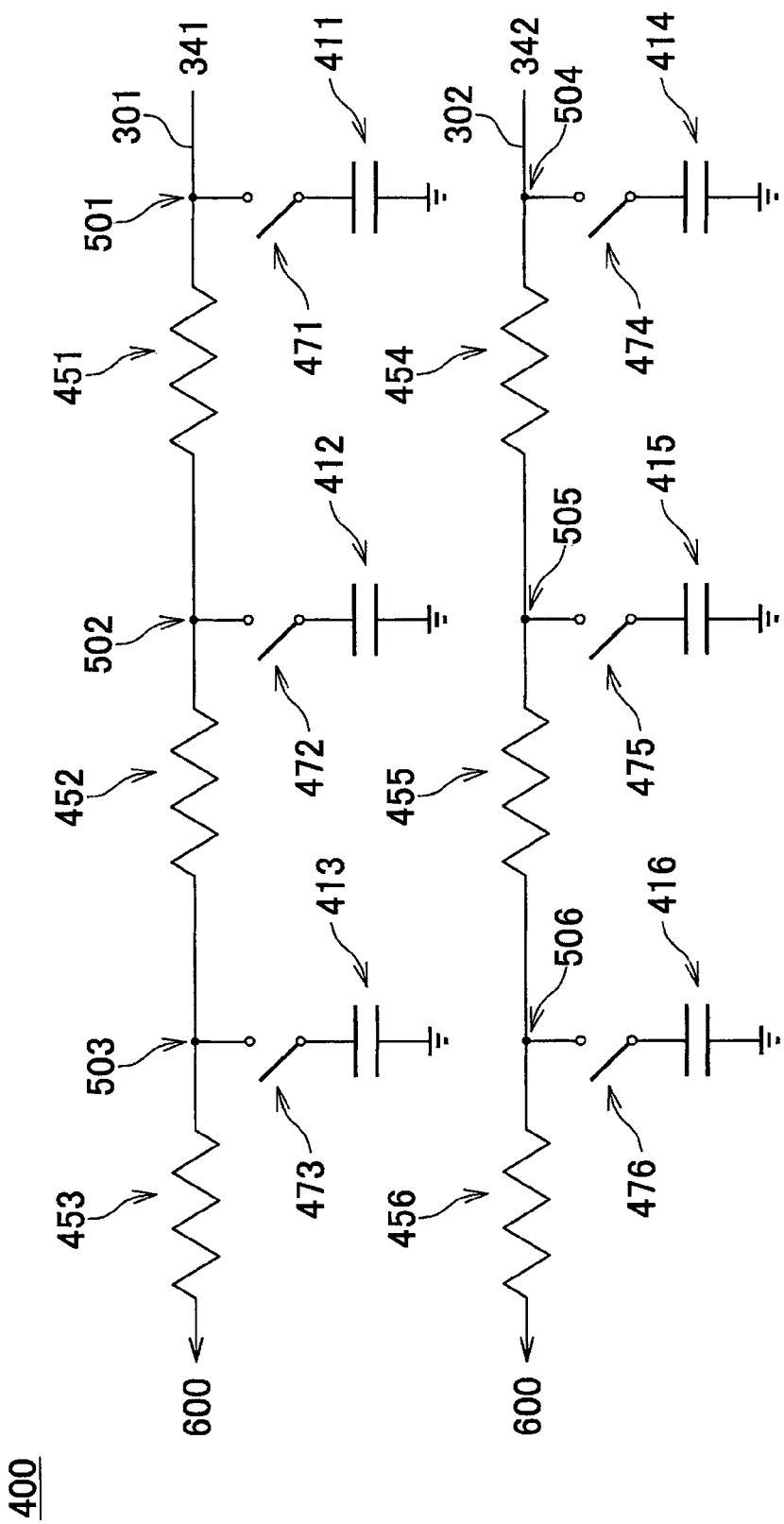
FIGS. 2 and 13 show alternative circuit configurations of the delay compensating circuit 400.

FIG. 2 shows a circuit configuration of the delay compensating circuit 400. As shown in FIG. 2, the delay compensating circuit 400 includes a plurality of capacitors 411 to 416 and a plurality of switches 471 to 476 that correspond one-to-one with the plurality of capacitors 411 to 416. The capacitors 411 to 416 are each connected between a reference potential and one of a plurality of junctions 501 to 506 located at spaced intervals on the positive signal transmission line 301 and the negative signal transmission line 302. The switches 471 to 476 are provided respectively between the capacitors 411 to 416 and a corresponding junction on one of the transmission lines. As shown in FIG. 2, for example, the switches and capacitors are provided in order, beginning with the switch 471 and the capacitor 411 provided between the ground potential and the junction 501 nearest the junction 341 on the positive signal transmission line 301.

The delay compensating circuit 400 further includes a plurality of resistors 451 to 456 provided on the positive signal transmission line 301 and the negative signal transmission line 302, as shown in FIG. 2. In this way, when the switch 471 is in a closed state, for example, the resistor 451 and the capacitor 411 act as a so-called RC integrator that can delay the rising time and the falling time of a signal waveform 731 of the positive signal transmitted on the positive signal transmission line 301 according to a time constant determined by the resistance of the resistor 451 and the capacitance of the capacitor 411. In the same way, when the switch 474 is in a closed state, for example, the resistor 454 and the capacitor 414 act as a so-called RC integrator that can delay the rising time and the falling time of a signal waveform 732 of the negative signal transmitted on the negative signal transmission line 302 according to a time constant determined by the resistance of the resistor 454 and the capacitance of the capacitor 414.

By opening and closing the switches 471 to 476 in this way, the delay compensating circuit 400 provides the positive signal transmission line 301 and the negative signal transmission line 302 with one to three RC integrators each. Therefore, the delay compensating circuit 400 can delay one or both of the positive signal and the negative signal transmitted on the positive signal transmission line 301 and the negative signal transmission line 302, or pass these signals without a delay. Since the delay compensating circuit 400 can increase or decrease the number of RC integrators operating on the positive signal transmission line 301 and the negative signal transmission line 302 by closing or opening the switches 471 to 476, the delay compensating circuit 400 can change the duration of the delay of the rising time and the falling time of the signal waveform 731 of the positive signal and the signal waveform 732 of the negative signal.

Figure 3:
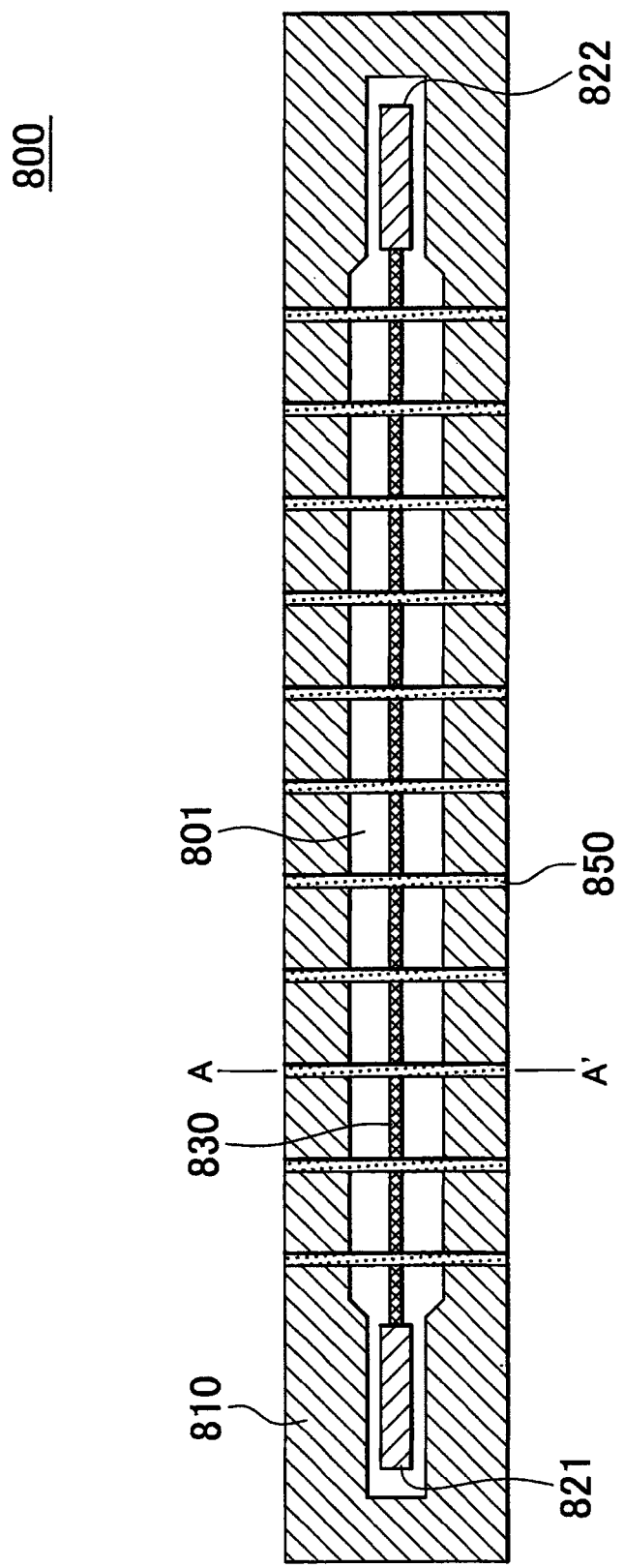
FIG. 3 is a schematic plan view showing a variable capacitance circuit 800, which is a portion of a specific example of the delay compensating circuit 400.
Figure 4:
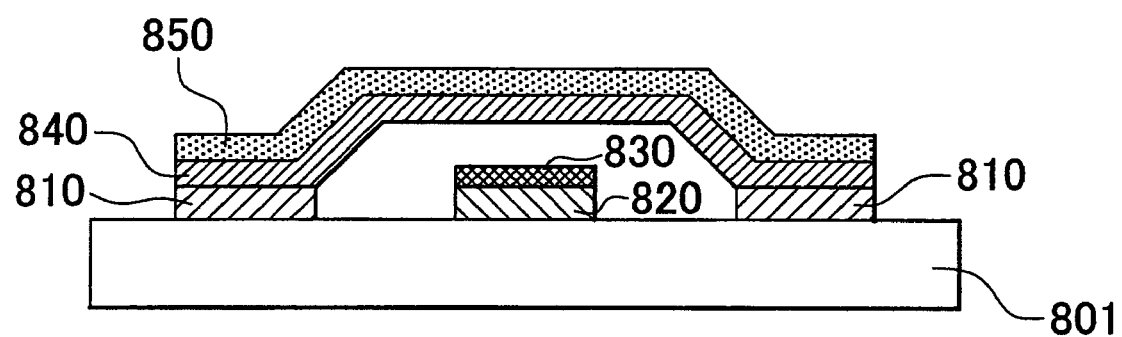
FIG. 4 is a cross-sectional view of a piezo element 850 in a normal state taken along the line A-A of FIG. 3.

FIG. 3 is a schematic plan view showing a variable capacitance circuit 800, which is a portion of a specific example of the delay compensating circuit 400. FIG. 4 is a cross-sectional view of a piezo element 850 in a normal state taken along the line A-A of FIG. 3. FIG. 5 is a cross-sectional view of the piezo element 850 in a stretched state taken along the line A-A of FIG. 3. As shown in FIGS. 3 and 4, the variable capacitance circuit 800 includes a ground electrode 810, a signal transmission line 820, a dielectric layer 830, a bridge electrode 840, and the piezo element 850. The variable capacitance circuit 800 may be provided on each of the positive signal transmission line 301 and the negative signal transmission line 302 in the delay compensating circuit 400.

The ground electrode 810 and the signal transmission line 820 are formed with space between each other on an insulated substrate 801. The ends of the signal transmission line 820 are probe pads 821 and 822. If the variable capacitance circuit 800 is provided on the positive signal transmission line 301 side of the delay compensating circuit 400, for example, the probe pad 822 connects to the positive signal transmission line 301 on the junction 341 side and the probe pad 821 connects to the positive signal transmission line 301 on the comparator 600 side. If the variable capacitance circuit 800 is provided on the negative signal transmission line 302 side of the delay compensating circuit 400, for example, the probe pad 822 connects to the negative signal transmission line 302 on the junction 342 side and the probe pad 821 connects to the negative signal transmission line 302 on the comparator 600 side.

The dielectric layer 830 is provided on the signal transmission line 820. The bridge electrode 840 is provided on the ground electrode 810 in a manner to span over the signal transmission line 820. The bridge electrode 840 faces the top of the dielectric layer 830. The piezo element 850 is provided on the bridge electrode 840. The bridge electrode 840 and the piezo element 850 are an example of a switch in the present invention, and the coupling capacitance formed between the signal transmission line 820 and the bridge electrode 840 when the bridge electrode 840 is brought near the dielectric layer 830 is an example of a capacitor in the present invention.

In the variable capacitance circuit 800, the bridge electrode 840 is separated from the dielectric layer 830 when there is no input from the control apparatus 60, as shown in FIG. 4. When there is input from the control apparatus 60, voltage is applied to the piezo element 850 to cause the piezo element 850 to stretch, which causes the bridge electrode 840 to bend downward. The bridge electrode 840 is brought near the dielectric layer 830 in this way to form a coupling capacitance between the signal transmission line 820 and the ground electrode 810 via the bridge electrode 840 and the dielectric layer 830.

The following describes an operation of the test apparatus 10. First, before testing the device under test 45 held on the performance board 40 using the following method, the test apparatus 10 detects the delay between the signals transmitted by the positive signal transmission line 301 and the negative signal transmission line 302.

In this case, with the switches 331 and 332 in opened states, the control apparatus 60 sends an instruction for generating pattern data of a signal used for delay detection to the pattern generating section 110. Upon receiving the instruction for generating the pattern data from the control apparatus 60, the pattern generating section 110 generates the pattern data of the delay detection signal and outputs the pattern data to the waveform shaping section 120. The waveform shaping section 120 shapes the pattern data generated by the pattern generating section 110 and sends the result to the driver 200. The driver 200 converts the pattern data shaped by the waveform shaping section 120 into a differential detection signal 710, which is a differential signal expressed by the potential difference between the positive signal and the negative signal.

Figure 6:
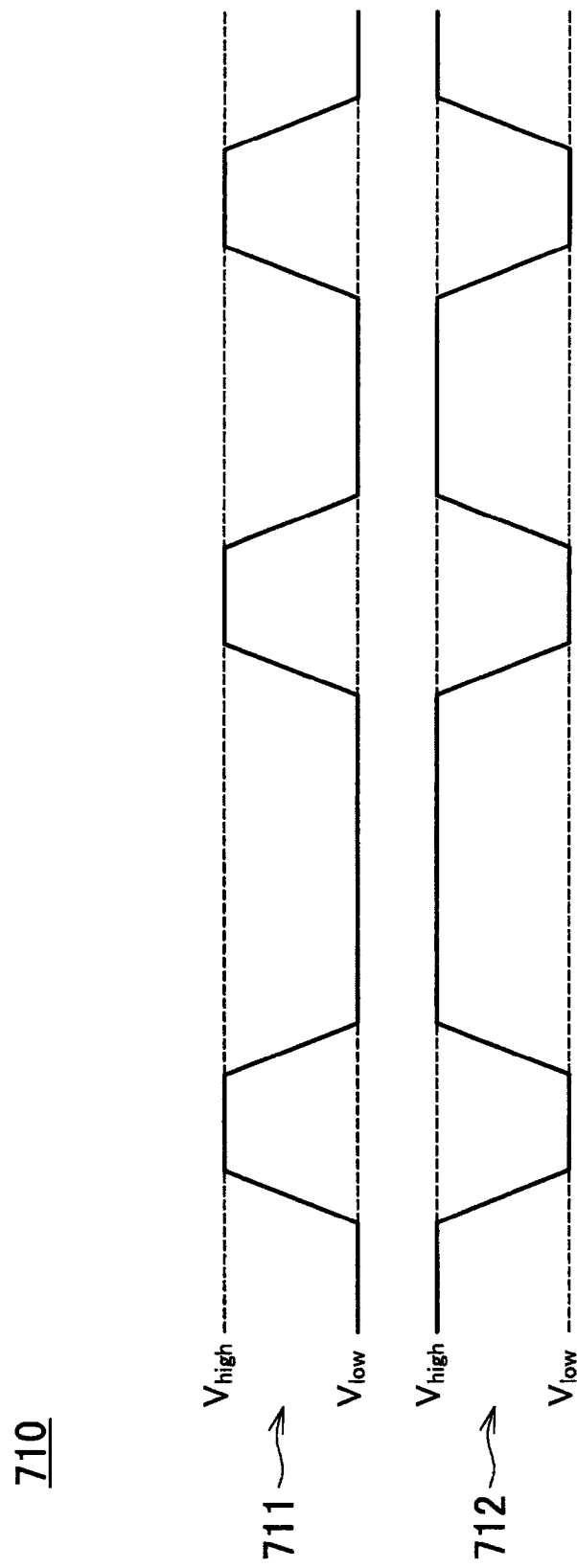
FIG. 6 shows an exemplary signal waveform 711 of the positive signal and the signal waveform 712 of the negative signal in the differential detection signal 710.

FIG. 6 shows examples of the signal waveform 711 of the positive signal and the signal waveform 712 of the negative signal in the differential detection signal 710. The signal waveforms 711 and 712 shown in FIG. 6 are detected at a position surrounded by the dotted line labeled "A" on the positive signal transmission line 301 and the negative signal transmission line 302 shown in FIG. 1. A direction to the right in FIG. 6 indicates a positive direction on the time axis.

As shown in FIG. 6, the driver 200 generates, according to the pattern data, the differential detection signal 710 made up of (i) the positive signal having the signal waveform 711 with a signal voltage Vhigh greater than a reference voltage Vlow and (ii) the negative signal having the signal waveform 712 in which the reference voltage is Vhigh and the signal voltage is Vlow. The driver 200 outputs the positive signal and the negative signal of the generated differential detection signal 710 to the positive signal transmission line 301 and the negative signal transmission line 302, respectively.

Here, the positive signal is transmitted by the positive signal transmission line 301 and reflected at one of the terminals of the switch 331, after which the positive signal is again transmitted by the positive signal transmission line 301 and input to the comparator 600 and the control apparatus 60 via the junction 341 and the delay compensating circuit 400. The negative signal is transmitted by the negative signal transmission line 302 and reflected at one of the terminals of the switch 332, after which the negative signal is again transmitted by the negative signal transmission line 302 and input to the comparator 600 and the control apparatus 60 via the junction 342 and the delay compensating circuit 400. Here, the "differential reflection signal 730" refers in particular to the differential signal made up of the positive signal reflected at the one of the terminals of the switch 331 and the negative signal reflected at the one of the terminals of the switch 332.

Figure 7:
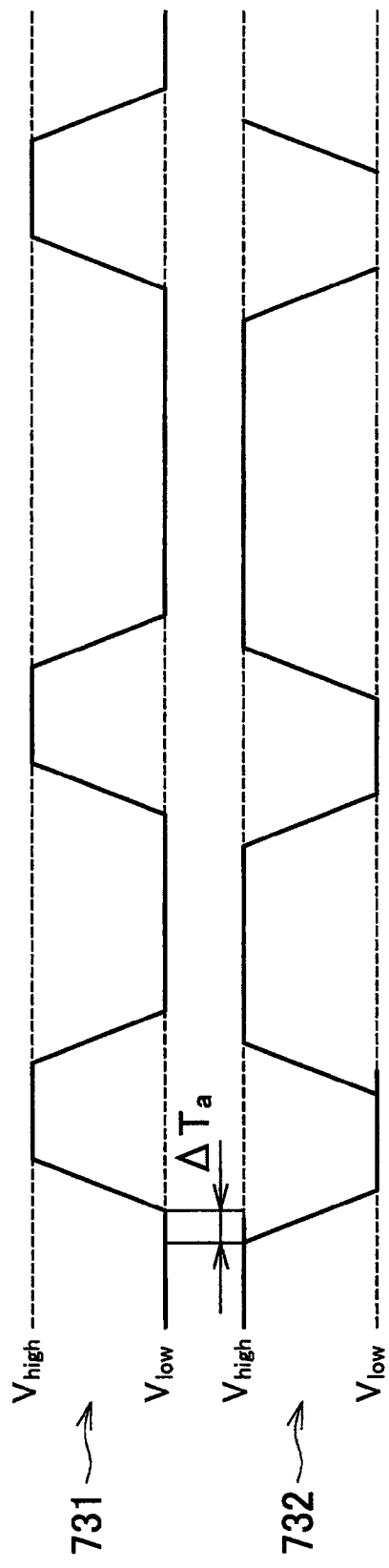
FIG. 7 shows an exemplary signal waveform 731 of the positive signal and the signal waveform 732 of the negative signal in the differential reflection signal 730.

FIG. 7 shows examples of the signal waveform 731 of the positive signal and the signal waveform 732 of the negative signal in the differential reflection signal 730. The signal waveforms 731 and 732 shown in FIG. 7 are detected at a position surrounded by the dotted line labeled "B" on the positive signal transmission line 301 and the negative signal transmission line 302 shown in FIG. 1. In the example of FIG. 7, the signal waveform 731 of the positive signal in the differential reflection signal 730 is delayed by a duration of $\Delta Ta$ in relation to the signal waveform 732 of the negative signal.

Figure 8:
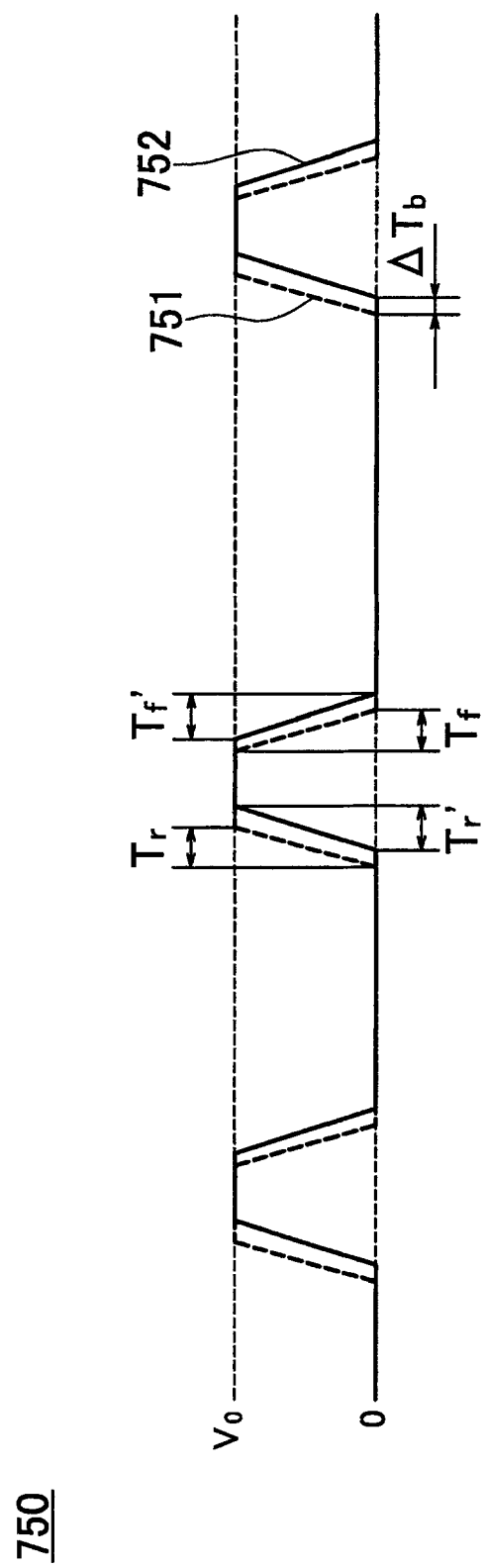
FIG. 8 shows an exemplary signal waveform of the comparison result signal 750 output by the comparator 600 based on a comparison result of the input differential signal.

FIG. 8 shows an exemplary signal waveform of the comparison result signal 750 output by the comparator 600 based on a comparison result of the input differential signal. The signal waveforms 751 and 752 shown in FIG. 8 are detected at a position surrounded by the dotted line labeled "D" on the transmission line on the output side of the of the comparator 600 shown in FIG. 1. The signal waveform 751 shown by the dotted lines in FIG. 8 is the signal waveform of the comparison result signal 750 resulting from the differential detection signal 710 including the signal waveforms 711 and 712 of FIG. 6 being input into the comparator 600 without a delay. The signal waveform 752 shown by the solid lines in FIG. 8 is the signal waveform of the comparison result signal 750 resulting from the differential reflection signal 730 including the signal waveforms 731 and 732 of FIG. 7 being input into the comparator 600.

As shown in FIG. 8, the signal waveform 752 of the comparison result signal 750 resulting from the differential reflection signal 730 being input to the comparator 600 is delayed by a duration of $\Delta Tb$ in relation to the signal waveform 751 of the comparison result signal 750 resulting from the differential detection signal 710 being input to the comparator 600. The rising time Tr' and the falling time Tf' of the signal waveform 752 are longer than the rising time Tr and the falling time Tf of the signal waveform 751. In this way, the signal waveform of the comparison result signal 750 output from the comparator 600 is different depending on whether there is a delay between the positive signal and the negative signal input to the comparator 600.

Here, since the test apparatus 10 judges the acceptability of the test result based on the signal waveform of the comparison result signal 750, it is preferable that there be no delay between the positive signal and the negative signal in the differential signal input to the comparator 600. Therefore, the control apparatus 60 controls the opening and closing of the switches 471 to 476 in the delay compensating circuit 400 as described below.

The control apparatus 60 stores in advance the compensation times of the RC circuits in association with the corresponding switches 471 to 476. With the switches 331 and 332 in an open state, the control apparatus 60 compares the signal waveform 731 and the signal waveform 732 of the differential reflection signal 730 reflected at the switches 331 and 332. In this way, the control apparatus 60 calculates the duration ΔTa of the delay of the signal waveform 731 in the differential reflection signal 730 in relation to the signal waveform 731, using the example shown in FIG. 7. In this case, the control apparatus 60 may calculate the difference between the time at which the signal waveform 731 begins to rise and the time at which the signal waveform 732 begins to fall by measuring the number of internal clocks.

The control apparatus 60 determines which of the switches 471 to 476 to use for compensating for the time difference, based on the delay duration and on which of the signal waveform 731 or the signal waveform 732 is delayed. In this case, the control apparatus 60 preferably selects a switch corresponding to an RC integrator that has a compensation time closest to the duration ΔTa, e.g. the switch 474.

By controlling the opening and closing of the switches 471 to 476 in the delay compensating circuit 400 based on the result of the above determination, the control apparatus 60 delays the rising time and the falling time of the signal waveform of the positive signal or the negative signal by a certain amount. This delay amount is equal to the delay of the positive signal in relation to the negative signal or the delay of the negative signal in relation to the positive signal. Accordingly, by closing at least one of the switches 474 to 476 in the delay compensating circuit 400 based on the determination result, the control apparatus 60 delays the rising time and the falling time of the signal waveform 732 of the negative signal transmitted on the negative signal transmission line 302. If the signal does not go back and forth over the positive signal transmission lines 301 and 311 or the negative signal transmission lines 302 and 312, that is, if the signal is transmitted in only one direction on the positive signal transmission lines 301 and 311 or the negative signal transmission lines 302 and 312, the control apparatus 60 preferably selects a switch corresponding to an RC integrator having a compensation delay that causes the delay duration of the signal transmitted on the negative signal transmission lines 302 and 312 to be half of the duration necessary for the signal transmitted on the positive signal transmission lines 301 and 311 to go back and forth.

Figure 9:
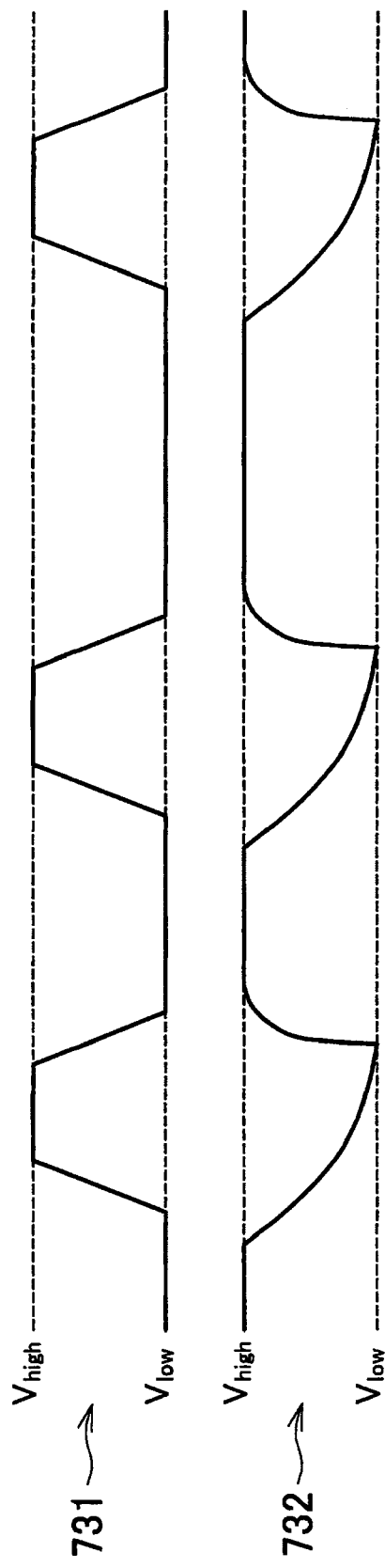
FIG. 9 shows exemplary signal waveforms of the differential reflection signal 730 in which the rising time and the falling time of the signal waveform 732 of the negative signal is delayed.

FIG. 9 shows exemplary signal waveforms of the differential reflection signal 730 in which the rising time and the falling time of the signal waveform 732 of the negative signal is delayed. The signal waveforms 731 and 732 shown in FIG. 9 are detected at a position surrounded by the dotted line labeled "C" on the transmission lines on the output side of the comparator 600 shown in FIG. 1. By delaying the rising time and the falling time of the signal waveform 732 of the negative signal transmitted on the negative signal transmission line 302 in the delay compensating circuit 400, the signal waveform 732 of the of the negative signal of the differential reflection signal 730 becomes a substantially sawtooth wave with a delayed rising time and falling time, as shown in FIG. 9.

The control apparatus 60 supplies the comparator 600 with the differential reflection signal 730 in which the rising time and the falling time of the signal waveform of either the positive signal or the negative signal (the negative signal in this case) is delayed. The control apparatus 60 detects the signal waveform 752 of the comparison result signal 750 output from the comparator 600. In this way, the signal waveform from the comparator 600 is nearly identical to the signal waveform 751 of FIG. 8, except for having a delay. In other words, the rising time Tr and the falling time Tf of the signal waveform from the comparator 600 can be limited to the width of the signal waveform 751 of FIG. 8.

After the control apparatus 60 sets the switches for compensating for the delay, the test apparatus 10 tests the device under test 45 held on the performance board 40. Testing begins with the switches 331 and 332 on the positive signal transmission line 301 and the negative signal transmission line 302 of the cable unit 30 in a closed state. The control apparatus 60 supplies the pattern generating section 110 with the instruction for generating the pattern data of the test signal to be input to the device under test 45 held on the performance board 40. The control apparatus 60 closes a switch, i.e. switch 474, corresponding to an RC integrator for compensating for the delay. Upon receiving the signal sent from the control apparatus 60 for generating the pattern data, the pattern generating section 110 generates the pattern data of the test signal and outputs this pattern data to the waveform shaping section 120. The waveform shaping section 120 shapes the pattern data generated by the pattern generating section 110 and sends the result to the driver 200.

The driver 200 generates the differential test signal based on the pattern data shaped by the waveform shaping section 120. The differential test signal is a differential signal expressed by the potential difference between the positive signal and the negative signal, in the same manner as the differential detection signal 710. The driver 200 outputs the positive signal and the negative signal of the generated differential test signal to the positive signal transmission line 301 and the negative signal transmission line 302, respectively.

Here, the positive signal and the negative signal are respectively transmitted via the positive signal transmission line 301 and the negative signal transmission line 302 to be input to the device under test 45 held by the performance board 40 through the respective terminals 43 and 44. In this way, the functions allocated to the terminals 43 and 44 in the device under test 45 can be tested. The positive signal and the negative signal input to the terminals 43 and 44 of the device under test 45 are output from the terminal 43 of the device under test 45 and transmitted back through the positive signal transmission line 301 and the negative signal transmission line 302 to be input to the comparator 600 via the junctions 341 and 342 and the delay compensating circuit 400. Here, the "differential output signal" refers specifically to the differential signal made up of the positive signal and the negative signal used for testing the device under test 45.

The delay occurring between the positive signal and the negative signal of the differential output signal is compensated for in the delay compensating circuit 400. For example, when the control apparatus 60 selects to close the switch 474, the RC integrator corresponding to the switch 474 delays the negative signal of the differential detection signal by the compensation time.

Upon receiving the differential output signal, the comparator 600 compares the positive signal and the negative signal of the differential output signal, and generates the comparison result signal 750 based on the result of the comparison. At this time, since the delay between the positive signal and the negative signal of the differential output signal is compensated for as described above, the rising time Tr and the falling time Tf of the differential output signal from the comparator 600 can be kept short, in the same manner as shown in FIG. 9.

The comparison result signal of the differential output signal generated by the comparator 600 is input to the control apparatus 60 via the transmission line. The control apparatus 60 judges whether the device under test 45 is defective based on the signal waveform of the comparison result signal of the differential output signal.

Therefore, the test apparatus 10 provided with the delay compensating circuit 400 can compensate for the difference in transmission time between the positive signal transmitted by positive signal transmission line 301 and the negative signal transmitted by the negative signal transmission line 302, and input the compensated differential signal to the comparator 600. In this way, rising time Tr and the falling time Tf of the differential output signal from the comparator 600 can be kept short and the waveform of the differential output signal can be preserved, thereby achieving accurate test results.

The control apparatus 60 described above calculates the time difference between the signal waveform 731 of the positive signal and the signal waveform 732 of the negative signal in the differential reflection signal 730 based on an internal clock, but the method for calculating the time difference is not limited to this. Other methods include the control apparatus 60 calculating the time difference based on the slope of the signal waveform of the comparison result signal 750 input from the comparator 600 in relation to the rising time, in relation to the slope of the falling time, or in relation to the slope of both, where a smaller slope indicates a larger time difference. In this case, the control apparatus 60 may filter a high-frequency component of the rising time or the like of the signal waveform in the comparison result signal 750, and calculate a larger time difference for a smaller intensity of the high-frequency component, since a high-frequency component with a small intensity corresponds to a rising time or the like with a smaller slope.

Each capacitor 411 to 416 in the delay compensating circuit 400 may have a different capacitance. Furthermore, the delay compensating circuit 400 described above has a maximum of three RC integrators that can be provided on each of the positive signal transmission line 301 and the negative signal transmission line 302 by opening and closing the switches 471 to 476, but more RC integrators may be provided by increasing the number of resistors, capacitors, and switches on each of the positive signal transmission line 301 and the negative signal transmission line 302. By providing more RC integrators to compensate for the time delay between the positive signal and the negative signal of the differential output signal, the capacitance of the capacitor of each RC integrator can be decreased, even if the time delay between the signals is large. Accordingly, it is less likely that a large reflection of the signal occurs in each RC integrator.

As described above, each of the capacitors 411 to 416 is provided between the reference potential and one of a plurality of junctions 501 to 506 provided at equal intervals on each of the positive signal transmission line 301 and the negative signal transmission line 302. Therefore, even if a reflection of the signal occurs in each of the RC integrators including the capacitors 411 to 416, distortion of the transmitted signal can be prevented because the phase of the signal reflected in each RC integrator is different.

The resistors 451 to 456 may be line resistances on the transmission lines of the positive signal transmission line 301 and the negative signal transmission line 302. In this case, the number of components used in the delay compensating circuit 400 can be decreased.

Figure 13:
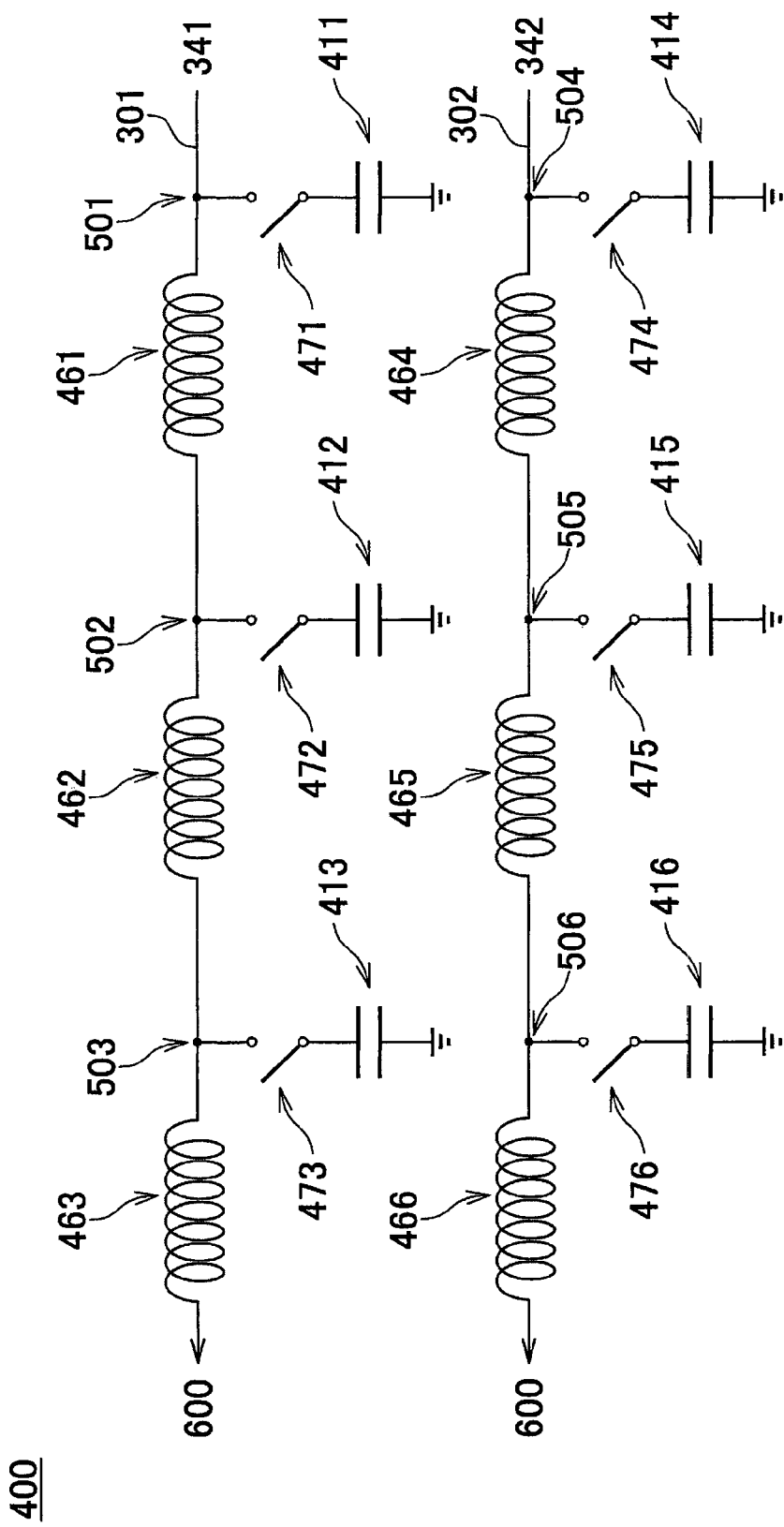

Instead of the resistors 451 to 456, the delay compensating circuit 400 may include inductance elements 461 to 466 as shown in FIG. 13. In this case, when the switch 471 is in a closed state, for example, the rising time and the falling time of the signal waveform 731 of the positive signal transmitted on the positive signal transmission line 301 can be delayed by the capacitor 411 and the inductance element 461 provided in place of the resistor 451. This delay amount depends on a time constant designated by the inductance of the inductance element 461 and the capacitance of the capacitor 411. One example of such an inductance element is an air-core coil.

The delay compensating circuit 400 described above is made up of passive elements such as the resistors 451 to 456, the capacitors 411 to 416, and the inductance elements 461 to 466. Using active elements such as transistors in the delay compensating circuit 400 might change the signal waveform 731 of the positive signal or the signal waveform 732 of the negative signal in the differential reflection signal 730. This change in the signal waveforms is an undesirable trait in the test apparatus 10. By using passive elements in the delay compensating circuit 400 of the test apparatus 10 as described in the above embodiments, the signal waveform 731 of the positive signal or the signal waveform 732 of the negative signal in the differential reflection signal 730 can be delayed without being changed.

Figure 10:
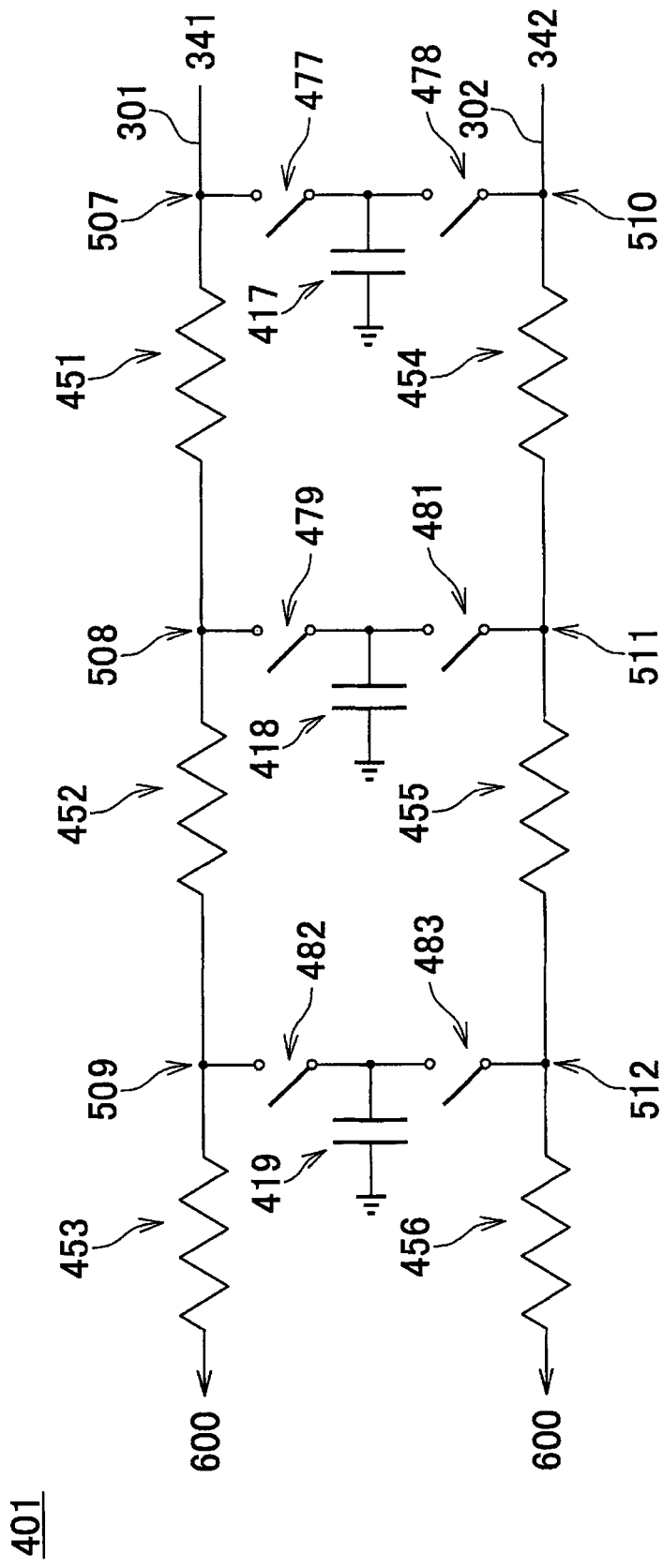
FIG. 10 shows a circuit configuration of a delay compensating circuit 401.

FIG. 10 shows a circuit configuration of a delay compensating circuit 401. The test apparatus 10 may be provided with the delay compensating circuit 401 of FIG. 10 in place of the delay compensating circuit 400 of FIG. 1. As shown in FIG. 10, the delay compensating circuit 401 includes a plurality of capacitors 417 to 419 and a plurality of switches 477 to 479 and 481 to 483. The switches 477, 479, and 482 are provided between the capacitors 417 to 419 and the positive signal transmission line 301. The switches 478, 481, and 483 are provided between the capacitors 417 to 419 and the negative signal transmission line 302. Each of the capacitors 417 to 419 is provided between the reference potential and one of the plurality of junctions 507 to 512 provided at equal intervals on the transmission lines of the positive signal transmission line 301 and the negative signal transmission line 302. The switches 477, 479, and 482 are provided respectively between the capacitors 417 to 419 and the junction of the positive signal transmission line 301. The switches 478, 481, and 483 are provided respectively between the capacitors 417 to 419 and the junction of the negative signal transmission line 302.

As shown in FIG. 10, the delay compensating circuit 401 includes the plurality of resistors 451 to 456 on the transmission lines of the positive signal transmission line 301 and the negative signal transmission line 302. Therefore, when the switch 478 is in an open state and the switch 477 is in a closed state, for example, the resistor 451 and the capacitor 417 act as an RC integrator that can delay the rising time and the falling time of the signal waveform of the positive signal transmitted on the positive signal transmission line 301 according to a time constant determined by the resistance of the resistor 451 and the capacitance of the capacitor 417. The opening and closing of the switches 477 to 479 and 481 to 483 in the delay compensating circuit 401 are controlled by the control apparatus 60 in the same manner as the switches 471 to 476 in the delay compensating circuit 400.

In this way, the delay compensating circuit 401 can be configured such that the capacitors 417 to 419 can be used in a shared arrangement when the RC integrators are provided on the transmission lines of the positive signal transmission line 301 and the negative signal transmission line 302. By using the delay compensating circuit 401, the number of components in the test apparatus 10 can be decreased without changing the maximum number of RC integrators that can be provided on the transmission lines of the positive signal transmission line 301 and the negative signal transmission line 302.

FIG. 11 shows a circuit configuration of a delay compensating circuit 402. The test apparatus 10 may be provided with the delay compensating circuit 402 of FIG. 11 in place of the delay compensating circuit 400 or the delay compensating circuit 401. As shown in FIG. 11, the delay compensating circuit 402 includes switches 484 and 485 and partial transmission paths 421 and 422 provided serially on the transmission lines of the positive signal transmission line 301 and the negative signal transmission line 302. The partial transmission paths 421 and 422 are formed of groups of transmission lines made of the same material as the positive signal transmission line 301 and the negative signal transmission line 302.

When the switch 484 in the delay compensating circuit 402 is switched from the state shown in FIG. 11 so that the positive signal transmitted on the positive signal transmission line 301 passes through the partial transmission path 421, the transmission time of the positive signal on the positive signal transmission line 301 increases by the time necessary for the positive signal to pass through the partial transmission path 421. Accordingly, the positive signal that is input to the comparator 600 after passing through the partial transmission path 421 on the positive signal transmission line 301 is delayed in relation to the negative signal input to the comparator 600 without passing through the partial transmission path 422 on the negative signal transmission line 302.

In the delay compensating circuit 402, if the switch 484 is switched so that the positive signal transmitted on the positive signal transmission line 301 passes through the partial transmission path 421 or if the switch 485 is switched so that the negative signal transmitted on the negative signal transmission line 302 passes through the partial transmission path 422, such that one of the signals is delayed in relation to the other, this delay can be compensated for. Since the signal waveforms of the positive signal and the negative signal do not change as a result of the compensation when the delay compensating circuit 402 is used, the comparator 600 can output a more accurate test result signal. In the delay compensating circuit 402, the control apparatus 60 controls the opening and closing of the switches 484 and 485 in the same manner as the switches 471 to 476 in the delay compensating circuit 400.

Figure 12:
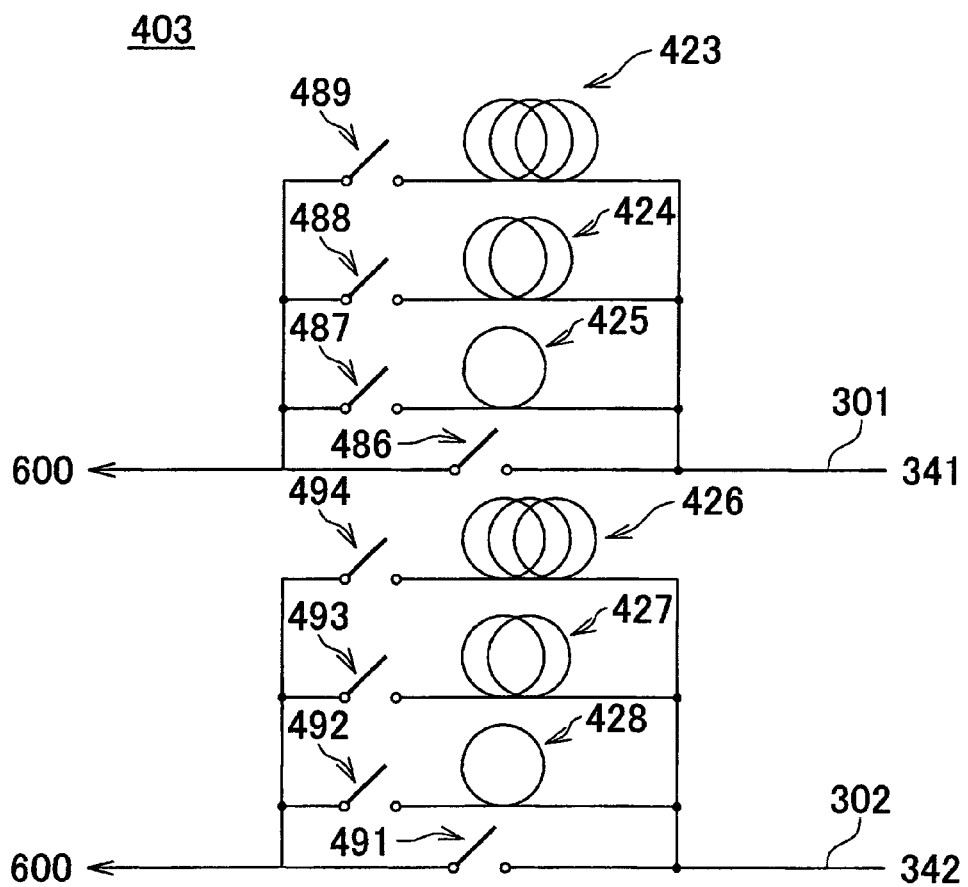
FIG. 12 shows a circuit configuration of a delay compensating circuit 403.

FIG. 12 shows a circuit configuration of a delay compensating circuit 403. The test apparatus 10 may be provided with the delay compensating circuit 403 of FIG. 12 in place of any one of the delay compensating circuits 400, 401, and 402. As shown in FIG. 5, the delay compensating circuit 403 includes partial transmission paths 423 to 425 connected in parallel to the positive signal transmission line 301, and switches 487 to 489 provided to correspond respectively with the partial transmission paths 423 to 425. The delay compensating circuit 403 further includes partial transmission paths 426 to 428 connected in parallel to the negative signal transmission line 302, and switches 492 to 494 provided to correspond respectively with the partial transmission paths 426 to 428. The lengths of the partial transmission paths 423, 424, and 425 decrease in the stated order. The lengths of the partial transmission paths 426, 427, and 428 also decrease in the stated order. Each of the partial transmission paths 423 to 428 is made up of a group of transmission lines made from the same material as the positive signal transmission line 301 and the negative signal transmission line 302. The switch 486 provided on the positive signal transmission line 301 is closed when the positive signal transmitted on the positive signal transmission line 301 is to be transmitted without passing through the partial transmission paths 423 to 425. The switch 491 provided on the negative signal transmission line 302 is closed when the negative signal transmitted on the negative signal transmission line 302 is to be transmitted without passing through the partial transmission paths 426 to 428.

In the delay compensating circuit 403, the positive signal transmitted on the positive signal transmission line 301 can be passed through a selected partial transmission path 423 to 425, each transmission line having a different length, by opening or closing the switches 486 to 489. Therefore, when one of either the positive signal or the negative signal is delayed in relation to the other, the test apparatus 10 can more accurately compensate for the delay depending on the duration of the delay. The control apparatus 60 controls the opening and closing of the switches 486 to 494 in the delay compensating circuit 403 in the same manner as the switches 471 to 476 in the delay compensating circuit 400.

In the embodiment shown in FIG. 1, the delay compensating circuit 400 is provided between the comparator 600 and the junctions 343 and 344 of the positive signal transmission line 311 and the negative signal transmission line 312, but the position of the delay compensating circuit 400 is not limited to this. For example, the delay compensating circuit 400 may be provided between the driver 200 and the junctions 341 and 342 of the positive signal transmission line 301 and the negative signal transmission line 302.

In the embodiment shown in FIG. 1, the switches 331 and 332 are provided at the performance board 40 side on the positive signal transmission line 311 and the negative signal transmission line 312 of the cable unit 30, but the position of the switches is not limited to this. The switches 331 and 332 may be provided at any position on the positive signal transmission path and the negative signal transmission path. Furthermore, the switches 331 and 332 need not be provided on the positive signal transmission path and the negative signal transmission path. In this case, the positive signal transmission path and the negative signal transmission path can be electrically connected or separated from the performance board 40 by attaching or removing the performance board 40 to or from the cable unit 30 via a connector. Therefore, with the end of the connector of the cable unit 30 left open, the test apparatus 10 can detect and compensate for the delay between the signal sent on the transmission path of the positive signal, which includes the positive signal transmission lines 301 and 311, and the signal sent on the transmission path of the negative signal, which includes the negative signal transmission lines 302 and 312. Therefore, even when the switches 331 and 332 are not provided, the signal lines 41 and 42 of the performance board 40 can be electrically connected or disconnected to or from the terminals 43 and 44 of the device under test 45 by attaching or removing the device under test 45 to or from the socket 46 of the performance board 40 when the performance board 40 is mounted on the cable unit 30. Therefore, with the terminals 43 and 44 of the socket 46 of the device under test 45 serving as open ends of the signal lines 41 and 42 of the performance board 40, the test apparatus 10 can detect and compensate for the delay between (i) the signal sent on the transmission path that includes the positive signal transmission lines 301 and 311 and the signal line 41 and (ii) the signal sent on the transmission path that includes the negative signal transmission lines 302 and 312 and the signal line 42.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can be used to realize the differential signal transmission apparatus that can compensate for the time difference, i.e. skew, caused by the delay compensating circuit, the skew being the time difference between the positive signal and the negative signal transmitted on the positive signal transmission line and the negative signal transmission line, respectively. The delay compensating circuit can change the compensation time in various ways according to the time difference by connecting the capacitors that are provided to correspond with the switches. Each of the capacitors is provided between the reference potential and one of the plurality of junctions that are provided on at least one of the positive signal transmission line and the negative signal transmission line. The test apparatus provided with the differential signal transmission apparatus using the delay compensating circuit can accurately compensate for the time difference from a test result signal based on the result of a comparison between the positive signal and the negative signal resulting from a test signal being input to the device under test.

What is claimed is:

1. A differential signal transmission apparatus that transmits a differential signal expressed by a potential difference between a positive signal and a negative signal, comprising:
 a positive signal transmission line that transmits the positive signal;
 a negative signal transmission line that transmits the negative signal; and
 a delay compensating circuit that compensates for a time difference between a transmission time for the positive signal to transmit through the positive signal transmission line and a transmission time for the negative signal to transmit through the negative signal transmission line, the delay compensating circuit having a variable compensation time.

2. The differential signal transmission apparatus according to claim 1, wherein the delay compensating circuit comprises:
 a capacitor; and
 a switch that inserts the capacitor between a reference potential and one of the positive signal transmission line and the negative signal transmission line.

3. The differential signal transmission apparatus according to claim 2, wherein
 at least one of the positive signal transmission line and the negative signal transmission line is provided with a plurality of junctions provided with space therebetween,
 the delay compensating circuit includes:
  a plurality of the capacitors; and
  a plurality of the switches, and
 each of the plurality of switches is provided to correspond to one of the capacitors, and connects the corresponding capacitor between the reference potential and one of the plurality of junctions.

4. The differential signal transmission apparatus according to claim 3, wherein
 the delay compensating circuit further comprises:
  a plurality of inductance elements each of which is provided serially in one of the positive signal transmission line and the negative signal transmission line.

5. The differential signal transmission apparatus according to claim 3, wherein
 the positive signal transmission line and the negative signal transmission line are each provided with a plurality of junctions provided with space between each other.

6. The differential signal transmission apparatus according to claim 2, wherein the delay compensating circuit further comprises:
 an inductance element provided serially in one of the positive signal transmission line and the negative signal transmission line.

7. The differential signal transmission apparatus according to claim 2, wherein
 the delay compensating circuit includes:
  a plurality of the capacitors; and
  a plurality of the switches, and
 each of the plurality of switches is provided to correspond to one of the capacitors, and inserts the corresponding capacitor between a reference potential and one of the positive signal transmission line and the negative signal transmission line.

8. The differential signal transmission apparatus according to claim 7, wherein
 the delay compensating circuit includes a plurality of inductance elements each of which is provided serially in one of the positive signal transmission line and the negative signal transmission line, and
 one of the plurality of switches inserts the corresponding capacitance element between the reference potential and the positive signal transmission line and another of the plurality of switches inserts the corresponding capacitance element between the reference potential and the negative signal transmission line.

9. The differential signal transmission apparatus according to claim 8, wherein
 at least a portion of each of the positive signal transmission line and the negative signal transmission line is a coaxial cable surrounded by a shield with the reference potential.

10. The differential signal transmission apparatus according to claim 1, wherein the delay compensating circuit includes:
 a plurality of capacitors having different capacitances from each other; and
 a switch that selects a capacitor from among the plurality of capacitors and connects the selected capacitor between the reference potential and one of the positive signal transmission line and the negative signal transmission line.

11. The differential signal transmission apparatus according to claim 10, wherein
 the delay compensating circuit includes a plurality of the switches,
 one of the plurality of switches connects a selected capacitor between the reference potential and the positive signal transmission line, and another of the plurality of switches connects a selected capacitor between the reference potential and the negative signal transmission line.

12. The differential signal transmission apparatus according to claim 1, wherein the delay compensating circuit includes:
a plurality of partial transmission paths having different lengths from each other; and
a switch that selects one of the plurality of partial transmission paths and inserts the selected partial transmission path serially in one of the positive signal transmission line and the negative signal transmission line.

13. The differential signal transmission apparatus according to claim 12, wherein
the delay compensating circuit includes a plurality of the switches,
one of the plurality of switches inserts a selected partial transmission path serially in the positive signal transmission line, and
another of the plurality of switches inserts a selected partial transmission path serially in the negative signal transmission line.

* * * * *